(12) United States Patent
Takikawa et al.

(10) Patent No.: US 6,827,823 B2
(45) Date of Patent: Dec. 7, 2004

(54) NANO-CARBON AND COMPOSITE MATERIAL OR MIXED MATERIAL CONTAINING NANO-CARBON AND METAL FINE PARTICLE AND METHODS FOR PRODUCING AND PATTERNING THE SAME

(75) Inventors: Hirofumi Takikawa, Aza Uehara 1-3 (1-104), Ohgasaki-cho, Toyohashi-shi Aichi-ken (JP); Yoshihiko Hibi, Toyohashi (JP); Shigeo Itoh, Mobara (JP)

(73) Assignees: Futaba Corporation, Mobara (JP); Hirofumi Takikawa, Toyohashi (JP)

( * ) Notice: Subject to any disclaimer, the term of this patent is extended or adjusted under 35 U.S.C. 154(b) by 0 days.

(21) Appl. No.: 10/094,622

(22) Filed: Mar. 12, 2002

(65) Prior Publication Data

US 2002/0127351 A1 Sep. 12, 2002

(30) Foreign Application Priority Data

Mar. 12, 2001 (JP) ........................................ 2001-068413
Feb. 21, 2002 (JP) ........................................ 2002-044554

(51) Int. Cl.[7] .............................................. B01J 19/08
(52) U.S. Cl. .................................... 204/173; 423/445 B
(58) Field of Search ...................... 204/173; 423/445 B

(56) References Cited

U.S. PATENT DOCUMENTS 6,149,775 A * 11/2000 Tsuboi et al. ................ 204/173

OTHER PUBLICATIONS

U.S. patent application Ser. No. 09/989,024, Takikawa et al., filed Nov., 2001.*
U.S. patent application Ser. No. 10/138,570, Takikawa et al., filed May 6, 2002.
U.S. patent application Ser. No. 10/334,904, Takikawa et al., filed Jan. 2, 2003.

* cited by examiner

Primary Examiner—Kishor Mayekar
(74) Attorney, Agent, or Firm—Oblon, Spivak, McClelland, Maier & Neustadt, P.C.

(57) ABSTRACT

Described herein is a method of preparing nano-carbon; a method of preparing an electron emitting source by supporting the soot; and an apparatus for preparing the same. A torch electrode 10 of an arc torch 1 as a first electrode is placed opposite to a material to be arced 2 using graphite as a second electrode. A voltage is applied between the torch electrode 10 and an edge portion of the material to be arced 2 to generate arc discharge, to evaporate the edge portion of the material to be arced 2 exposed to the arc discharge, to generate soot. The soot thus generated is deposited on the surface of a substrate opposite to an arc discharge-generating area through a mask having a patterned opening.

19 Claims, 14 Drawing Sheets

NANO-CARBON AND COMPOSITE MATERIAL OR MIXED MATERIAL CONTAINING NANO-CARBON AND METAL FINE PARTICLE AND METHODS FOR PRODUCING AND PATTERNING THE SAME

BACKGROUND OF THE INVENTION

1. Field of the Invention

The present invention relates to a method for preparing nano-carbon and nano-carbon prepared by making use of such method, and a composite material or mixed material containing nano-carbon and metal particles, an apparatus for preparing nano-carbon, a method for patterning nano-carbon and a nano-carbon base material patterned by making use of such method, and an electron emitting source using such a patterned nano-carbon base material.

The present invention is particularly suitable for a process for preparing an electron emitting source composed of particles in nano-scale ($10^{-6}$ to $10^{-9}$ m) made up of carbon as a main component or a gas storage material, for example hydrogen storage material.

2. Description of the Prior Art

An explanation is given below for an electron emitting source:

A field electron emitting source has properties of energy saving and long service life, compared with a thermal electron emitting source requiring heating. At present, materials for field electron emitting source include a semiconductor such as Si (silicon), metal such as Mo (molybdenum), W (tungsten) and the like, carbon material in nano-scale size represented by carbon nano-tube (hereinafter referred to as "carbonaceous nano-material"). Above all, a carbonaceous nano-material has sufficient size and sharpness for concentrating electrical field and is relatively stable chemically and excellent in mechanical strength, and therefore, has a good prospect for a field electron emitting source.

A conventional method for preparing a nano-tube, a typical carbon nano-material, includes a laser abrasion method, an arc discharge method between graphite electrodes in an inert gas, a CVD (Chemical Vapor Deposition) method using hydrocarbon gas and so on. Particularly, a nano-tube prepared by an arc discharge method is suitable for a field electron emitting source for few defects in an atomic arrangement.

A process of a conventional arc discharge method is described below:

After placing oppositely two graphite electrodes in a container, the container is evacuated, and then, an inert gas is introduced into the container to generate arc. An anode irradiated with arc is evaporated vigorously to produce soot which is deposited on the surface of a cathode. After continuing the arc discharge for more than several minutes, an apparatus is opened to atmosphere and deposits on the cathode are taken out. The deposits on the cathode are composed of a soft core containing a nano-tube and a hard shell containing no nano-tube. When graphite containing a metal catalyst is used as an anode, a nano-tube exists in soot. A nano-tube is taken out of the soft core or soot, which is supported on a substrate and used as an electron emitting source.

Problems encountered by a carbonaceous nano-material such as a nano-tube according to a conventional arc discharge method and a method of preparing an electron emitting source made of the carbonaceous nano-material are as follows:

A vacuum container, a vacuum exhaust system and an inert gas introducing apparatus are required at the time of producing a nano-material, and the cost of apparatus is relatively high. Exhaust and open to atmosphere have to be repeated and process is long. Since recovery of the deposits on a cathode or recovery of soot and cleaning of the apparatus must be carried out every time after completion of the process, the conventional method is not suitable for continuous mass production. In addition, many processes such as separation of soft core and hard shell, isolation from soot, purification, supporting on a substrate and so on are required in order to make an electron emitting element by making use of the carbonaceous nano-material prepared by such method.

SUMMARY OF THE INVENTION

An object of the present invention is to provide a method of preparing nano-carbon comprising evaporating a material containing carbon as a main component by means of arc discharge which does not necessarily require a process container and so on, but uses an apparatus having a welding arc torch or an analogous structure to generate nano-carbon-containing soot and recovering the soot, and to provide an apparatus for preparing the same.

Another object of the present invention is to provide a method of preparing an electron emitting source in which nano-carbon acts for an electron emitting source, comprising supporting the soot on a substrate, and to provide an apparatus for preparing the same.

Further object of the present invention is to provide a method of recovering the soot comprising placing a base material in the surrounding area of discharge or in the surrounding area of scattering of thesoot, recovering the soot deposited on the base material through the base material, and to provide an apparatus for preparing the same, so as to make production and recovery easy. Similarly, still further object of the present invention is to provide a method of recovering soot comprising placing fluid (liquid) in the surrounding area of discharge or in the surrounding area of scattering of soot, and recovering the soot dispersed and dissolved in the fluid through the fluid, and to provide an apparatus for preparing the same. Similarly, still further object of the present invention is to provide a method of recovering soot comprising placing a particulate material in the surrounding area of discharge or in the surrounding area of scattering of the soot, and recovering the soot deposited or dispersed in the particulate material through the particulate material, and to provide an apparatus for preparing the same.

In addition, the recovered nano-carbon or composite soot containing nano-carbon and metal fine particles (composite material) can be used as a hydrogen storage material.

These and other objects of the present invention can be achieved by the aspects of the present invention described below.

A first aspect of the present invention, there is provided a method of preparing nano-carbon comprising the steps of placing a first electrode opposite to a second electrode containing a carbon material as a main component in atmosphere or air; applying voltage between the first electrode and second electrode to generate arc discharge; evaporating the carbon material of the second electrode by said arc discharge to generate soot containing nano-carbon; and recovering the soot containing nano-carbon.

In the method of the first aspect of the present invention, the first electrode is a torch electrode mounted to an arc torch, and the method is provided with a step of generating nano-carbon-containing soot by evaporating the carbon material of the second electrode by the arc discharge while making relative movement between the torch electrode and the second electrode.

In the method of the first aspect of the present invention, a base material is placed opposite to the arc discharge-generating area, and the method comprises a step of recovering the nano-carbon-containing soot through the base material.

In the method of the first aspect of the present invention, fluid or particulate material is placed opposite to an arc discharge-generating area, and the method comprises a step of recovering the nano-carbon-containing soot through the fluid or particulate material.

In the method of the first aspect of the present invention, an angle which the first electrode forms with the second electrode is in the range of 45 degrees to 135 degrees.

In the method of the first aspect of the present invention, the soot material comprises a single layer carbon nano-tube, carbon nano-horn, multi-layer carbon nano-tube, carbon nano-fiber, carbon nano-particle, CN nano-tube, CN nano-fiber, CN nano-particle, BCN nano-tube, BCN nano-fiber, BCN nano-particle, fullerenes, or mixture thereof.

In the method of the first aspect of the present invention, the soot is a composite or mixed soot comprising nano-carbon and metal fine particles.

In the method of the first aspect of the present invention, the carbon material of the second electrode is graphite or activated carbon or amorphous carbon, additive-containing or additive-embedded graphite or activated carbon or amorphous carbon.

In the method described immediately above, the additive is Li, B, Mg, Al, Si, P, S, K, Ca, Ti, V, Cr, Mn, Fe, Co, Ni, Cu, Zn, Ga, Ge, As, Y, Zr, Nb, Mo, Rh, Pd, In, Sn, Sb, La, Hf, Ta, W, Os, Pt, or oxide or nitride or sulfide or chloride or sulfate or nitrate thereof or, mixture thereof.

In the method of the first aspect of the present invention, the arc discharge is operated by direct current or direct current plasma, and arc discharge of the second electrode is a cathode for arc discharge.

In the method of the first aspect of the present invention, the arc discharge is operated by alternating current or alternating current plasma.

In the method of the first aspect of the present invention, the nano-carbon-containing soot is generated by evaporating the carbon material in an edge or depression or projection of the second electrode by the arc discharge.

In the method of the first aspect of the present invention, the arc discharge is carried out while supplying specific gas or air into the arc discharge-generating area.

In the method of the first aspect of the present invention, the specific gas is rare gas such as Ar, He and so on, nitrogen gas, carbon dioxide gas, oxygen gas, hydrogen gas or mixed gas thereof.

In the method of the first aspect of the present invention, the first electrode contains as a main component high-melting point metal such as graphite, W (tungsten), Mo (molybdenum), or Ni (nickel) and so on.

According to a second aspect of the present invention, there is provided a nano-carbon prepared by making use of a method according to the first aspect of the present invention.

According to a third aspect of the present invention, there is provided a composite or mixed material comprising nano-carbon and metal particles prepared by making use of a method according to the first aspect of the present invention.

According to a fourth aspect of the present invention, there is provided an apparatus for preparing nano-carbon comprising: a pair of electrodes comprising a first electrode, and a second electrode containing as a main component a carbon material or an additive-containing carbon material, or a carbon material on the surface of which is formed an additive, being held in an atmosphere or air at a given interval; an arc generating means comprising an electric source for applying voltage between the first electrode and the second electrode to generate arc discharge by which the carbon material is evaporated to generate nano-carbon-containing soot; a means for supplying specific gas in an area generating arc discharge; and a recovering means for recovering the soot.

In the apparatus of the fourth aspect of the present invention, the first electrode is a torch electrode mounted on an arc torch; and the apparatus further comprises a means for moving the torch electrode relatively to the second electrode, and nano-carbon-containing soot is generated by generating arc discharge by applying voltage between the torch electrode and the second electrode while moving the torch electrode relaticely to the second electrode, thereby evaporating the carbon material in the edge or depression or projection of the second electrode.

In the apparatus of the fourth aspect of the present invention, the recovering means is fluid or particulate material; and the apparatus further comprises a container for the fluid or particulate material placed opposite to the arc discharge-generating area; and the nano-carbon-containing soot is recovered through the fluid or particulate material.

In the apparatus described immediately above, the fluid is water or liquid or oily fluid having fluidity below temperatures at which arc discharge is generated.

In the apparatus of the fourth aspect of the present invention, the apparatus further comprises a covering member for covering at least an arc-discharge-generating area generated between both electrodes of the first electrode and the second electrode.

According to a fifth aspect of the present invention, there is provided a method of patterning nano-carbon comprising the steps of: placing a first electrode opposite to a second electrode containing a carbon material as a main component in atmosphere or air; applying voltage between the first electrode and second electrode to generate arc discharge; evaporating the carbon material of the second electrode by the arc discharge to generate nano-carbon-containing soot; and placing a base material on the surface or upper portion of which is placed a mask having a patterned opening opposite to the arc discharge-generating area, thereby depositing the nano-carbon-containing soot on the surface of the base material corresponding to the opening.

In the method of the fifth aspect, the method further comprises a step of: placing the base material in fluid opposite to the arc discharge-generating area, thereby depositing the nano-carbon-containing soot on the surface of the base material corresponding to the opening.

According to a sixth aspect of the present invention, there is provided a method of patterning nano-carbon comprising the steps of: placing a first electrode opposite to a second electrode containing a carbon material as a main component in atmosphere or air; applying voltage between the first electrode and second electrode to generate arc discharge; evaporating the carbon material of the second electrode by the arc discharge to generate nano-carbon-containing soot; and placing a base material the surface of which has an adhesive layer opposite to the arc discharge-generating area, thereby depositing the nano-carbon-containing soot at least on the adhesive layer.

In the method of patterning nano-carbon according to the fifth or sixth aspect of the present invention, the first electrode is a torch electrode mounted on an arc torch, and the method further comprises a step for generating nano-carbon-containing soot by evaporating the carbon material in the edge or depression or projection of the second electrode by the arc discharge while moving the torch electrode relatively to the second electrode.

According to a seventh aspect of the present invention, there is provided a patterned nano-carbon base material by using the method according to the fifth or sixth aspect of the present invention.

According to an eighth aspect of the present invention, there is provided an electron emitting source characterized by using the patterned nano-carbon base material according to the seventh aspect of the present invention.

BRIEF DESCRIPTION OF THE DRAWINGS

For more complete understanding of the present invention may be had with reference to the following detailed explanations in connection with the accompanying drawings, in which.

DETAILED DESCRIPTION OF THE PREFERRED EMBODIMENT

Figure 1:
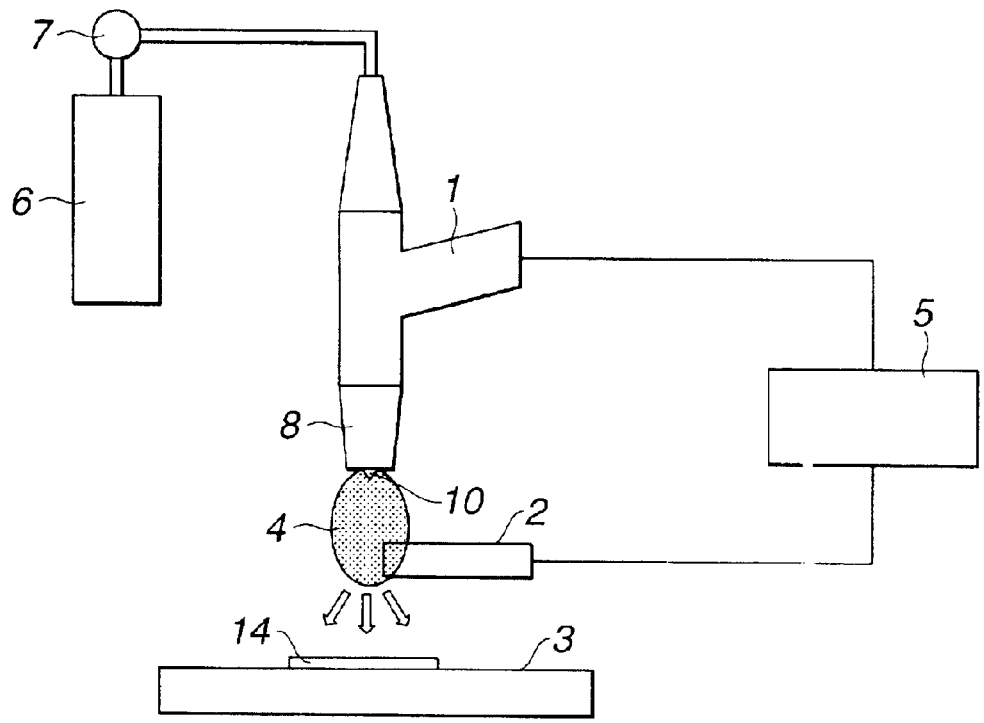
FIG. 1 is a schematic view showing an apparatus for preparing nano-carbon (composite soot comprising nano-carbon and metal particles).

Preferred embodiments of the present invention are described below with reference to the accompanying drawings. It will be understood that the present invention is not limited to the construction shown in the drawings, but includes various modifications and changes in design.

According to the present invention, a carbon nano-tube, carbon nano-fiber, carbon nano-particle (including nano-horn), CNnano-tube, CNnano-fiber, CNnano-particle, BCN nano-tube, BCNnano-fiber, BCN nano-particle, fullerene, or mixture thereof are collectively referred to as "nano-carbon material." The nano-carbon-containing soot of the present invention contains only carbon or at least metal fine particles other than carbon.

FIG. 1 is a schematic view showing an apparatus used for a method of preparing nano-carbon, a method of patterning nano-carbon, a method of preparing nano-carbon and a composite material comprising nano-carbon and metal fine particles (composite soot), and a method of preparing a nano-carbon base material and an electron emitting source. The apparatus shown in FIG. 1 also includes a patterning apparatus.

According to the present embodiments, arc discharge is generated to the edge portion of material to be arced for a short time by the use of a welding arc torch such as a general-purpose TIG (tungsten inert gas welding) and so on and an electric source (welding electric source) in an atmosphere (or at atmospheric pressure) or in air or in an atmosphere of given gas to evaporate the material to be arced to generate nano-carbon-containing soot, and the nano-carbon-containing soot thus generated is deposited on a base material which is an example of recovering member (collecting member).

The term "air" herein used denotes a gas composition roughly comprising nitrogen (X) and oxygen (Y) with X to Y ratio of 4:1, and the expression "in air" denotes approximately 0.5~1.5 atmospheric pressure (50 kPa~150 kPa).

TIG welding is a welding method in which arc discharge is generated between a W (tungsten) electrode and a base material usually in an enclosure by inert gas, and an additional metal is added, if necessary.

As shown in FIG. 1, the apparatus of the present invention comprises a welding arc torch 1 equipped with a torch electrode 10 as a first electrode; a material to be arced 2 as a second electrode placed opposite to the arc torch 1; an electric source 5 for welding which applies voltage between the arc torch 1 and the material to be arced 2 by, for example, contact striking, high voltage application, high-frequency application and so on to generate arc 4 by which the material to be arced is evaporated to generate nano-carbon-containing soot, a substrate (base material) 3 such as glass and so on as a recovering material on which the soot is deposited placed opposite to the arc 4; a gas bomb 6 as a gas supplying source for supplying specific gas to the arc torch 1; and a gas regulator and flowmeter 7 for adjusting flow of gas from the gas bomb 6. The torch electrode 10 is placed opposite to the material to be arced 2 containing carbon material as a main component in atmosphere or air. Reference numeral 8 is a tip or nose of the arc torch 1. Reference numeral 14 is soot deposited on the substrate 3.

Figure 2:
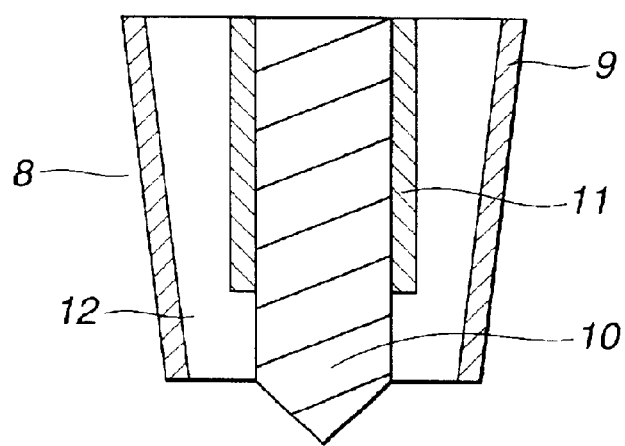
FIG. 2 is a partly enlarged sectional view of the apparatus for preparing nano-carbon shown by FIG. 1.

FIG. 2 is an enlarged sectional view of the tip 8 of the arc torch 1 of the apparatus for preparing nano-carbon shown by FIG. 1. As shown in FIG. 2, the tip 8 of the arc torch 1 comprises a nozzle 9 of the arc torch 1; a torch electrode 10 made of tungsten and so on as a first electrode; an electrode holder 11 for holding the torch electrode 10; and a apace between the nozzle 9 and the electrode holder 11 (arc-discharge-generating area) which is a flow channel of enclosed gas 12 supplied to the arc 4 generated between the arc torch 1 and the material to be arced 2.

The electric source 5 for the general-purpose TIG has a mechanism for allowing the specific gas 12 to flow into the arc torch 1 and usually supplies Ar (argon) gas. Gas used in the production of nano-carbon is not particularly limited, but may be rare gas such as Ar, He, and so on, air, $N_2$ (nitrogen) gas, carbon-containing gas such as $CO_2$ (carbon dioxide) gas, $O_2$ (oxygen gas), $H_2$ (hydrogen) gas or mixed gas thereof. It is not necessarily to allow the gas to flow. It is, however, preferable to allow the gas 12 to flow into the arc torch 12.

In particular, it is most preferable to use rare gas. This is because that the nano-carbon formed is hardly damaged, since the rare gas does not react chemically with nano-carbon. That is to say, since there is a possibility that nano-carbon reacts chemically with oxygen and so on in atmosphere to burn, that is, there is a high possibility that the nano-carbon formed is gasified or denatured, it is very effective to prevent such chemical reaction.

When sufficient amount of encapsulated gas 12 is allowed to flow, it is possible to prevent deposits from being deposited on the first electrode (cathode). If the amount of the encapsulated gas 12 is small, deposits are formed, which causes the deformation of the first electrode. In such case, arc discharge may be made unstable.

While the present invention does not require a container basically, the present invention may be carried out in a simple container as an enclosing means such as a vacuum container or pressurized container in order to keep the working area clean or in order to carry out in an atmosphere of inert gas or in order to prevent the influence of conversion by wind. The whole apparatus including a working part may be placed in a closed or open container. The pressure in the container (enclosed container) is not particularly limited, but may be preferably in the neighborhood of atmospheric pressure from the view point of operability. The expression "in the neighborhood of atmospheric pressure" denotes, for example, approximately 0.9~1.1 atmospheric pressure (90 kPa~110 kPa). Similarly, the atmosphere means generally gas around the celestial bodies, mainly, the earth. In the earth, the atmosphere is a mixture comprising nitrogen and oxygen as main components and small amounts of carbon dioxide, neon, helium, methane, hydrogen and so on.

The usual TIG welding makes use of a thorium-containing W electrode or cerium-containing W electrode as the torch source 10. In the production of nano-carbon, while such an electrode may be used, pure graphite may be preferably used as the torch source 10 in order to prevent melted fine particles from being deposited to an electron emitting source. A material comprising metal having a high melting point such as Mo or Ni as a main component may be used as the torch electrode. While the diameter of the torch electrode 10 is not particularly limited, approximately 1~7 mm may be preferable for the use of the general-purpose torch.

Further, the metal-made electrode holder 11 may be preferably subjected to water-cooling, similarly to general-purpose welding torch. When the arc 4 is generated continuously or intermittently for a long time for the production of nano-carbon material having a large area or for the continuous mass-production of nano-carbon or nano-carbon material, the torch electrode 10 as the first electrode and the electrode holder 11 are superheated. As a result, the torch electrode 10 is consumed vigorously and the electrode holder 11 per se may be damaged. When the electrode holder 11 is cooled by allowing gas 12 (specific gas) to flow in the arc torch 1, the electrode holder 11 per se is not damaged by heating, and the consumption of the electrode may be suppressed, because the torch electrode 10 is also cooled.

While arc discharge may be operated by direct current, direct current plasma, alternating current or alternating current plasma, direct current or direct current plasma may be preferable in order to generate a large amount of soot 14.

When the direct current or direct current plasma is used, evaporation is performed vigorously, because the temperatures of the point of evaporation is high and heated area is large, compared with the use of alternating current or alternating current plasma by which a cathode point is formed alternatively to the material to be arced. Therefore, it is more preferable to use the direct current or direct current plasma for the arc current.

The arc current may be preferably used in a wide range of 5 A~500 A. In order not to destroy the material to be arced, the arc current may be preferably 100 A~300 A.

When the arc is operated by pulse current, its frequency is not limited, but may be preferably 1 Hz~500 Hz from the viewpoint of the actual state of the general-purpose electric source.

When recovering the soot, a method may be used in which the soot is scraped by a scraper arranged at one place or plural places of the rotating point of the recovering plate as a base material, while rotating the recovering plate. However, the same effect can be obtained by reciprocating movement of the recovering plate.

The soot not only adheres to the recovering plate, but also floats in atmosphere (in an air in a sealed container). Accordingly, the recovery rate of the soot can be increased by recovering it by the use of suction apparatus and filter.

MIG (metal-electrode-inert-gas) torch may be used in stead of TIG arc torch. An apparatus having a structure analogous to TIG arc torch (welding torch) such as MAG (Metal-electrode-Active-Gas), plasma gouging (plasma cutting) may be used. A flame spraying torch (plasma spraying torch) and a movable arc torch for blast furnace may be also employed.

The material to be arced 2 comprises graphite as a main component and its shape, and size are not particularly limited, but may be preferably a thin plate-like shape or thin bar-like shape. For example, when the arc current is approximately 30~300 A, the material to be arced 2 may be preferably a thin plate or thin bar 1~3 mm in thickness and 10 mm in width. When the material to be arced 2 having more thickness and width is used, it is necessary to increase arc current.

The material to be arced 2 comprising a carbon material as a main component, that is, the material to be arced 2 containing a large amount of carbon material is an opposite electrode to the torch electrode 10. As such a carbon material may be used graphite, activated carbon, amorphous carbon and so on.

In order to protect the material to be arced 2 from heat of the arc 4, that is, in order to decrease the possibility that the material to be arced 2 is damaged by heat of the arc 4, it may be preferable to process the material to be arced 2 on a water-cooled bench 3 as a water-cooled electrode in order to cool the material to be arced 2.

The material to be arced 2 may be dried sufficiently or may contain water. When, however, the material to be arced 2 contains water, energy of the arc 4 is absorbed by evaporation of water. Therefore, the material to be arced 2 may be more preferably dried so as not to increase the temperatures of places of evaporation. Conversely, when the material to be arced 2 is wetted or humidified or contains water or is present in water, heating of the material to be arced 2 by the arc 4 can be prevented. Similarly, in order to prevent the material to be arced 2 from being superheated, the material to be arced 2 may be water-cooled directly or oil-cooled. A cooling medium such as water, carbon dioxide and so on may be blown or sprayed to the material to be arced 2.

While the material to be arced 2 may be pure graphite, it is preferable that the material to be arced 2 comprises graphite and additives which serve as a catalyst for accelerating evaporation or atomization of the soot, which are evaporated at the same time. Such additives may be Li(lithium), B(boron), Mg(magnesium), Al(aluminum), Si(silicon), P(phosphorus), S(sulfur), K(potassium), Ca(calcium), Ti(titanium), V(vanadium), Cr(chromium), Mn(manganese), Fe(iron), Co(cobalt), Ni(nickel), Cu(copper), Zn(zinc), Ga(gallium), Ge(germanium), As(arsenic), Y(yttrium), Zr(zirconium), Nb(niobium), Mo(molybdenum), Rh(rhodium), Pd(palladium), In(indium), Sn(tin), Sb(antimony), La(lanthanum), Hf(hafnium), Ta(tantalum), W(tungsten), Os(osmium), Pt(platinum), or oxide or nitride or sulfide or chloride or sulfate or nitrate thereof or mixture thereof.

Additives may be added or embedded in the graphite. Additives may be sprayed or applied to the graphite. Or the graphite may be plated or coated with additives. Or the additives may be placed on the graphite or interposed between formed articles of graphite. That is to say, it is sufficient that the material to be arced 2 has such a structure that the graphite and additives are heated by the arc 4 at the same time.

In order to evaporate efficiently the material to be arced 2, it is preferable to generate the arc discharge with respect to an edge portion or edge surface of the material such as a round bar, a square bar, a plate and so on or with respect to a hole such as a through-hole. When the place other than the edge portion of the material to be arced 2, for example a horizontal of plate, that is, a central portion of a plate is irradiated with the arc 4, the soot 14 is generated. It is, however, more preferable that the edge portion of the material to be arced 2 is irradiated with the arc in order to generate the soot in more high volumes. Conversely, when the place other than the edge portion of the material to be arced 2 is irradiated with the arc 4, it is preferable that a projection or a depression is formed on the material to be arced 2 and the projection including a projection formed by the formation of the depression is irradiated with the arc 4.

Figure 3A:
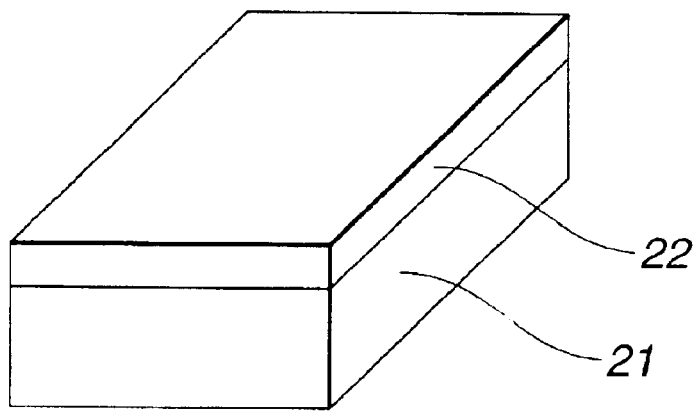
FIGS. 3(a) and 3(b) are perspective views
Figure 3B:
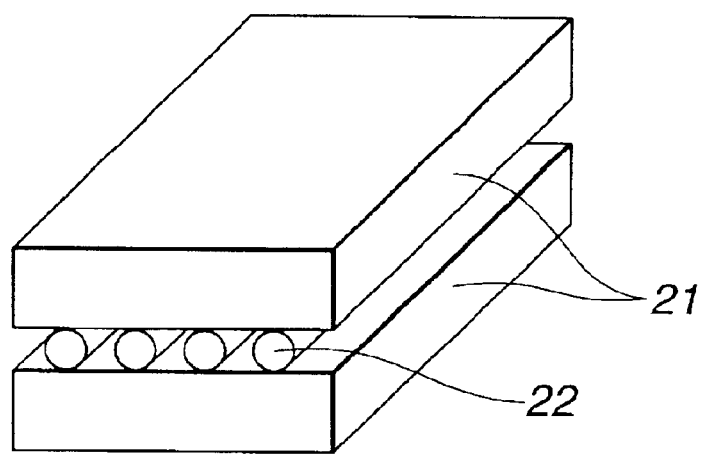

FIG. 3(a) shows the structure in which an additive 22 is sprayed or applied on the surface of the graphite 21, or the surface of the graphite 21 is plated or coated with the additive 22, or a plate made from the additive 22 is placed on a graphite plate 21 made from graphite. Similarly, FIG. 3(b) shows the structure in which wires of additive 22 are interposed between graphite plates 21, 21 made from graphite.

When the graphite 21 and the additive 22 are heated at the same time, evaporation of the material to be arced 2 is accelerated depending on the difference in evaporation temperatures. In more detail, the evaporation temperature of the additive 22 such as Ni, Y and so on is lower than the sublimation temperature of the graphite 21. Therefore, when fine particles of NI or Y are intermingled with the graphite, graphite about the fine particles is broken, because they are evaporated explosively inside the graphite 21. As a result, atomization (evaporation of the material to be arced 2) is more accelerated. Ni or Y aggregates in the cooling process to form fine particles which serve as a catalyst for the growth of a single-layer carbon nano-tube.

In order to generate a large amount of the soot 14 from the edge of the material to be arced 2 and to deposit the soot 14 on a substrate, it is preferable that the angle which the arc torch 1 forms with the material to be arced 2 is in the range of 45 degrees to 135 degrees.

Figure 4:
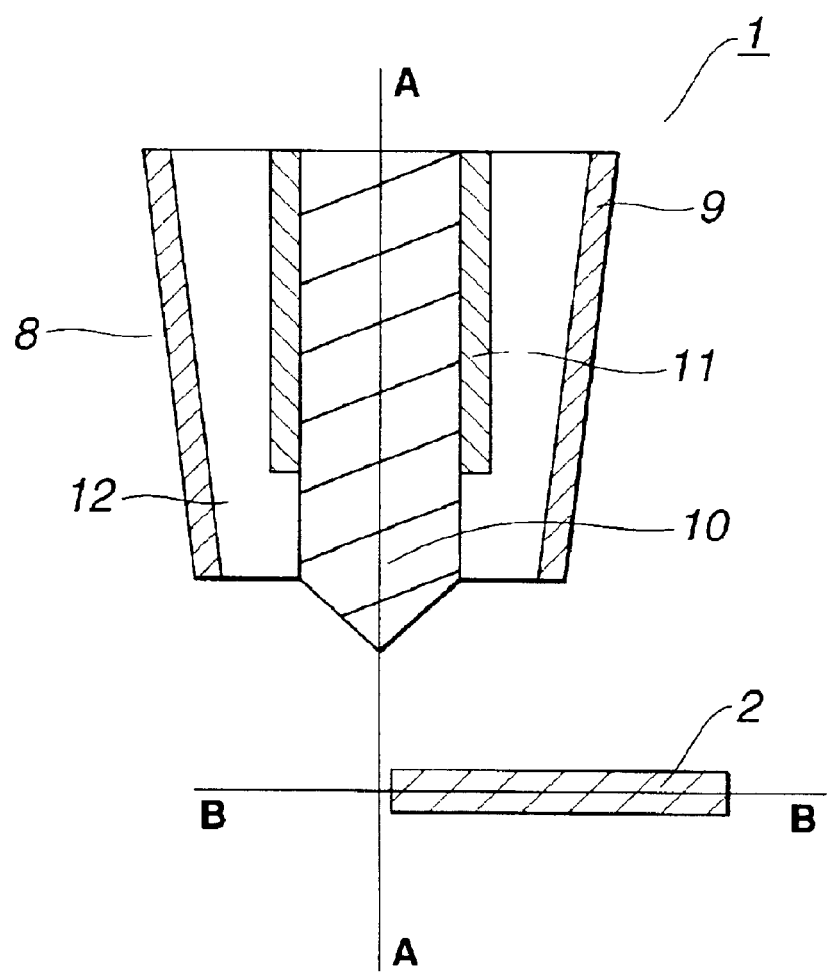
FIG. 4 is a partly enlarged sectional view showing an angle which an arc torch 1 forms with a material to be arced 2. schematic views.material to be arced 2.

The angle which the arc torch 1 forms with the material to be arced 2 is explained below;

FIG. 4 is a partly enlarged sectional view showing the angle which the arc torch 1 forms with the material to be arced 2.

As shown in FIG. 4, the substantial axis of the torch electrode 10 of the arc torch 1 is referred to as line "A". When the material to be arced 2 is a linear member, for example a wire the cross section of which is circle or square, the substantial axis of the linear member is referred to as line "B". In this case, the expression "the angle which the arc torch 1 forms with the material to be arced 2" means the angle which the line A forms with the line "B" (90 degrees in FIG. 4).

Similarly, when the material to be arced 2 is a plate-shaped member, for example, a rectangular parallelepiped, any one of X, Y and Z corresponds to the afore-said line B.

Figure 5:
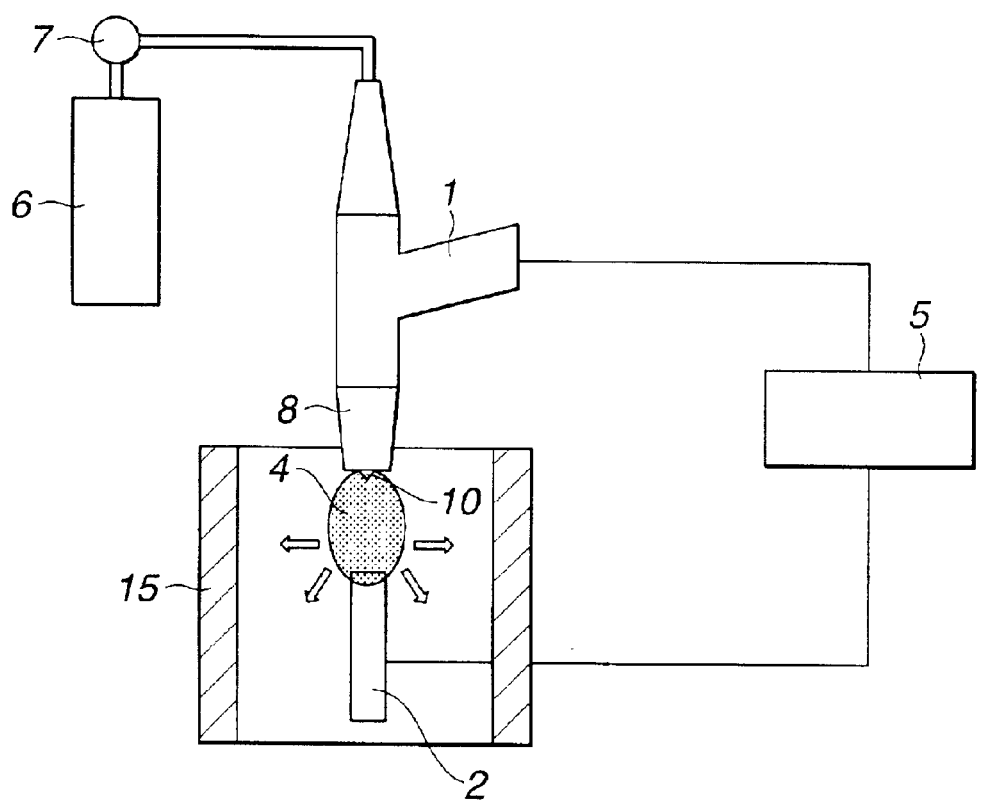
FIG. 5 is a schematic view showing a case where an arc torch 1 is placed in line with a material to be arced 2 (180 degrees).

As shown in FIG. 5, when the arc torch 1 and the material to be arced 2 are aligned (at angle of 180 degrees), the direction of the release of the soot 14 extends in a wide range. This is because that since an arc spot, that is, the place of arc discharge of the material to be arced 2 is not stable, the soot 14 is released in many directions of back and forth and right and left. In this case, it is preferable that a plural of substrates is placed opposite to the arc-discharge-generating area so as to enclose expected directions of release of the soot 14. In this case, when the substrate is a cylinder, only one cylinder is used.

The apparatus shown in FIG. 5 uses a covering member 15 which shares the function of the substrate instead of the substrate of the apparatus shown in FIG. 1. The covering member 15 is an open container made of glass, ceramics or metal. The covering member 15 has a shape of a cylinder or square column top and bottom surfaces of which are opened so as to enclose the torch electrode 10 of the arc torch 1, the material to be arced 2 and the arc 4. Thereby, it is possible to keep the working area clean or prevent the influences of convection caused by wind. When the covering member 15 is made in the form of a sealed container which encloses the arc torch 1, the material to be arced 2 and the arc 4, arc discharge can be carried out in an atmosphere of inert gas. And it is also possible to place the whole apparatus in the sealed container.

The covering member 15 shown in FIG. 5 shares the function of the substrate which is a base material on which the soot 14 is deposited (a recovering member). That is to say, the covering member 15 is placed so as to enclose the area where the soot 14 is scattered and has a size sufficient to deposit the soot 14. By using such a structure, the number of the components of the apparatus can be reduced. It is naturally possible to place separately. It should go without saying that the covering member 15 can be also applied to examples shown in FIGS. 1 and 6.

It is proper that the distance between the arc torch 1 and the material to be arced 2 is 0.1~10 mm.

It is proper that the distance between the material to be arced 2 and the substrate 3 is 1~50 mm.

In FIG. 1, while the material to be arced 2 and the substrate 3 are placed substantially in parallel, the angle which the material to be arced 2 forms with the substrate 3 is not limited, but may be, for example, perpendicular.

If the apparatus of the present invention is provided with a means for holding movably the material to be arced 2 in a given direction even when the graphite of the material to be arced 2 is evaporated, it is possible to adjust the distance between the material to be arced 2 and the torch electrode 10 of the arc torch 1 according to the degree of the evaporation of the graphite. It is natural to place a means for holding movably the torch electrode 10 or both of the electrode 10 and the material to be arced 2 in a given direction. Thereby, it is possible to maintain the optimum manufacturing conditions.

Similarly, if the apparatus of the present invention is provided with a means for moving an edge to the other edge when the graphite of the material to be arced 2 is evaporated and the shape of the edge of the material to be arced 2 or the shape of the projections of the material to be arced 2 begins to deform, it is possible to maintain the optimum manufacturing conditions.

Similarly, if the apparatus of the present invention is provided with a means for moving either the torch electrode 10 or the material to be arced 2 or both of them along the linear-shaped or face-shaped edge of the material to be arced 2 in a given direction when the edge of the material to be arced 2 has a linear or face shape and when the graphite of the material to be arced 2 is evaporated and the shape of the edge of the material to be arced 2 or the shape of the projections of the material to be arced 2 begins to deform, it is possible to maintain the optimum manufacturing conditions.

It is further preferable to combine the above-described two moving methods.

The relative movement between the arc torch 1 and the material to be arced 2 can be carried out manually (that is, by a human hand) or carried out automatically by using an apparatus provided with a moving means for moving the arc torch 1 in three directions, that is, in the directions of planes parallel to the material to be arced 2 (in the directions of X and Y), and in the direction perpendicular to the planes (in the direction of Z).

In particular, when the NC apparatus (numerically controlled apparatus) is used, it is possible to irradiate desired portions of the material to be arced 2, such as the edge (edge portion or edge face) of the material to be arced 2, or the depression or hole (through-hole) or projection of the material to be arced 2 with arc 4.

According to the method of the present invention, the continuous-mass production of the nano-carbon or nano-carbon-containing soot (nano-carbon-containing composite) is possible by changing successively the substrate 3 while adjusting the positions of the torch electrode 10 and the material to be arced 2 and the distance between them. According to the present invention, if a plurality of substrates 3 is sequentially placed, the continuous-mass production of the nano-carbon or nano-carbon-containing soot is possible by moving the torch electrode 10 relatively to the material to be arced 2 toward the group of the substrate 3 while adjusting the distance between the torch electrode 10 and the material to be arced 2. According to the present invention, if the substrates 3 has a large area, it is possible to prepare the nano-tube having a large area by adjusting the positions of the torch electrode 10 and the material to be arced 2 and the distance between them or by moving freely the substrate 3 per se.

In the above-described method of preparation, when air or nitrogen is used for gas flowing through the arc electrode 1, N-containing nano-carbon, that is, CN nano-tube can be prepared. When the graphite which contains B-containing material, or the graphite which contains a metal catalyst (additive), or the graphite to which B-containing material is sprayed or applied, or the graphite which is plated or coated with B-containing material, or the graphite to which B-containing material and additive-containing material are sprayed or applied, or the graphite which is plated or coated with B-containing material or additive-containing material is used as electrode to be arced, BCN network-containing nano-carbon, that is, BCN nano-tube can be prepared. Similarly, a wide variety of nano-carbon can be prepared by changing atmosphere gas or additive. B denotes boron, C denotes carbon, and N denotes nitrogen.

In the electron emitting source containing the nano-carbon prepared by the method described above, the performance of the electron emitting source can be increased by oxidizing the nano-particles inhibiting electron emission to remove.

Figure 6:
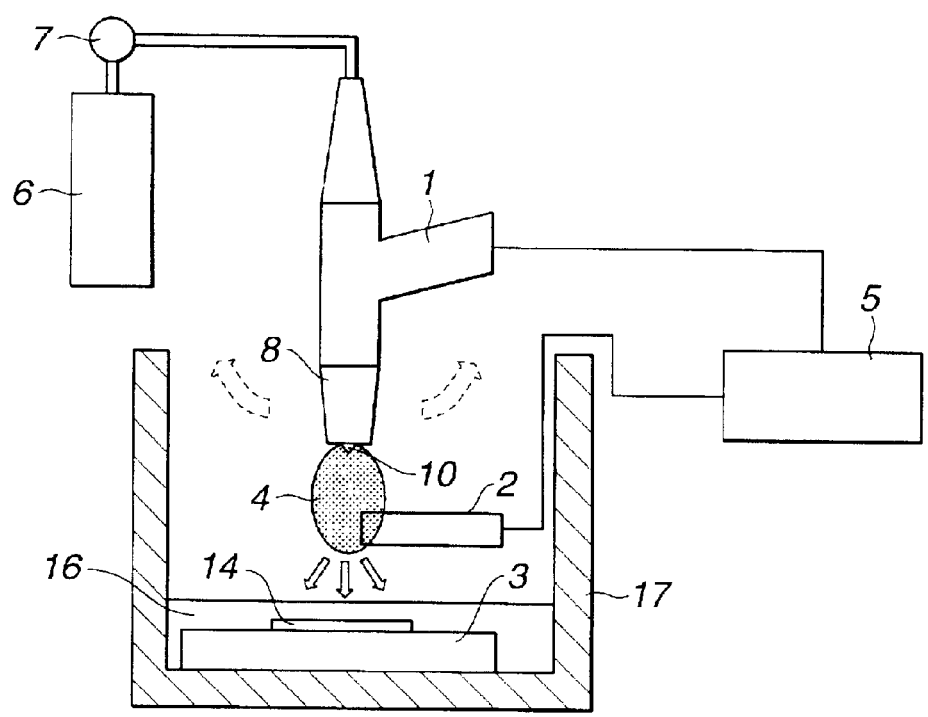
FIG. 6 is a schematic view showing a state where the direction of release of soot 14 is controlled by adjusting an angle which an arc torch 1 forms with a material to be arced 2.

As shown in FIG. 6, the direction of the release of the soot 14 can be controlled by the afore-said angle which the arc torch 1 forms with the material to be arced 2.

That is to say, when the arc torch 1 is inclined in the direction shown by the arrow, it is possible to change the position of the soot 14 deposited on the substrate 3 according to the degree of the inclination. The expression herein used "direction of the release of the soot 14" denotes the area where the probability that the soot 14 is deposited on the substrate 3 is most high, that is, the soot 14 is deposited in the most high.

Also, similar control can be made possible by adjusting the angle which the arc 14 forms with the substrate 3.

The apparatus shown in FIG. 6, comprises fluid (liquid) 16 such as water or silicone oil or oil (oil having fluidity below the temperatures at which arc charge is generated), and a container 17 for the fluid which contains the fluid and which is an open container made of glass, ceramics or metal, which are placed in the area where the soot 14 is scattered in addition to the base material shown in FIG. 1. The container 17 for the fluid contains the fluid 16 in which the substrate 3 is contained.

A low-temperature cooling medium such as aqueous solution, dry ice, liquid nitrogen, liquid helium and so on may be used as the fluid other than fluids described above.

The container 17 for the fluid is a cylinder or square column top face of which is opened so as to enclose the arc 4. Thereby, it shares the functions capable of keeping the working area clean and preventing the influences of convection caused by wind. That is to say, the container 17 is placed so as to cover the area where the soot 14 is scattered and has a size sufficient to deposit the soot 14. By using such a structure, the number of the components of the apparatus can be reduced. Needles to say, the base material is not necessarily used, when the nano-carbon is produced without patterning of the nano-carbon.

In this case, a heat-resistant fine particle such as sand, glass, ceramics, metal and so on (which are referred together to as "particulate material") may be used other than the fluids. The mixture of the afore-said fluids (liquids) with the above-described heat-resistant fine particles may be used. In this case, the container 17 is a container for the particulate material or the mixture of the fluids with the particulate material.

It is needless to say that the container 17 and so on can be applied to examples shown in FIGS. 1 and 6.

The container 17 for the fluid from which the base material 3 is removed shall be the container 17 for the fluids equipped with a channel having a closed system for circulating the fluid 16. A filtering member and so on having the function capable of recovering carbon-containing soot 14 is placed in the course of the channel. By using such a structure, it is possible to recover continuously the soot 14 and to provide a more simple method of production and an apparatus used therefore.

It is needless to say that the soot can be deposited on the surface of the fluid or precipitated in the fluid without placing the base material 3, and then the fluid can be purified and filtrated to extract and purify the desired nano-carbon.

According to the method of the present invention, the continuous-mass production of the nano-carbon or nano-carbon-containing soot (nano-carbon-containing composite) is possible by changing successively the substrate 3 while adjusting the positions of the torch electrode 10 and the material to be arced 2 and the distance between them. According to the present invention, if a plurality of substrates 3 is sequentially placed, the continuous-mass production of the nano-carbon or nano-carbon-containing soot is possible by moving the torch electrode 10 relatively to the material to be arced 2 toward the group of the substrate 3 while adjusting the distance between the torch electrode 10 and the material to be arced 2. According to the present invention, if the substrates 3 has a large area, it is possible to prepare the nano-tube having a large area by adjusting the positions of the torch electrode 10 and the material to be arced 2 and the distance between them or by moving freely the substrate 3 per se.

Figure 7:
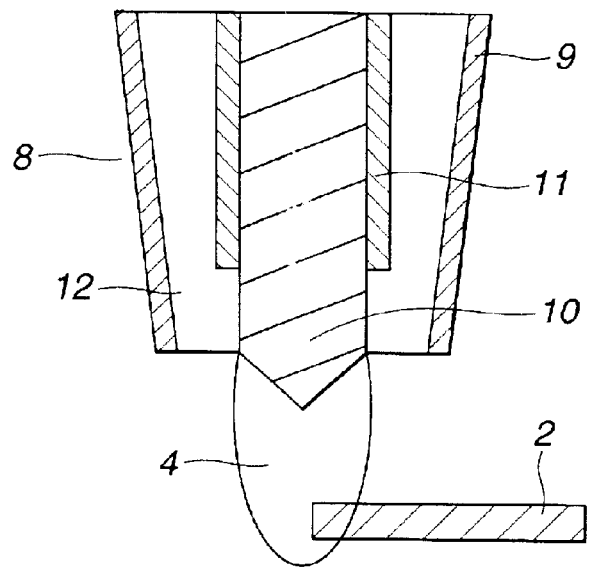
FIG. 7 is a schematic view showing an example of method (patternization) for forming nano-carbon in a specific place.
Figure 7:
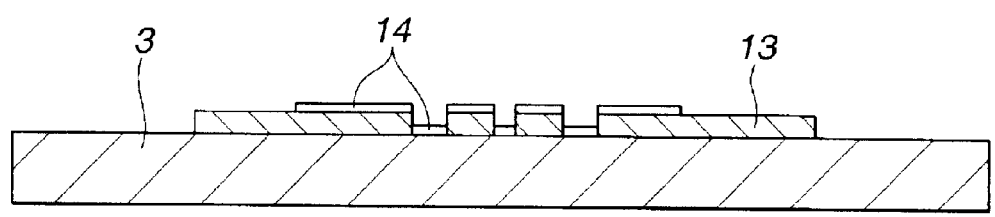

FIG. 7 shows an example of method of forming an electron emitting face on the substrate 3 in a given pattern. In this case, when the mask 13 is placed on the substrate 3, on which the soot 14 is deposited and then the mask 13 is removed, the electron emitting face having the same pattern as the mask 13 can be obtained. In this case, when an electrode corresponding to the opening of the mask is placed on the substrate 3, it can be used as a cathode electrode. When the substrate 3 shall be an insulating material and electrical wires are connected to each of the islands of the pattern, it is possible to emit an electron independently from each of the islands. This is a useful method for preparing a panel-type display.

The mask 13 may be placed in a space above the substrate 3, that is, in a space between the material 2 and the substrate 3. When the mask 13 is placed in the vicinity of the arc 4, a material which is resistant to high temperatures or thermal shock such as a metal having a high melting point, ceramics, and graphite and so on is preferably used.

Similarly, the substrate 3 used is not limited. In order to increase the adhesiveness between the substrate 3 and the soot 14 deposited on the surface of the substrate 3 or the electrical performances of the substrate 3 and the soot 14, an adhesive layer 23 may be placed on the substrate 3. In order to prevent the substrate 3 from the heat of the arc 4, the substrate 3 may be cooled when it is manufactured.

It is preferable that the substrate 3 is cooled by a cooling means for the substrate 3 installed when manufacturing the substrate 3, because the possibility that the substrate 3 is broken is reduced.

When alternating current or alternating current plasma is used, pure graphite, graphite containing an additive-containing material, graphite to which an additive-containing material is sprayed or applied, graphite which is plated or coated with an additive-containing material, graphite to which an additive-containing material is deposited, or graphite in which an additive-containing material is injected may be used as the material to be arced 2.

On the other hand, when direct current or direct current plasma is used, while pure graphite can not be used, the graphite containing an additive-containing material, the graphite to which an additive-containing material is sprayed or applied, the graphite which is plated or coated with an additive-containing material, the graphite to which an additive-containing material is deposited or the graphite in which an additive-containing material is injected may be used as the material to be arced 2.

Figure 8A:
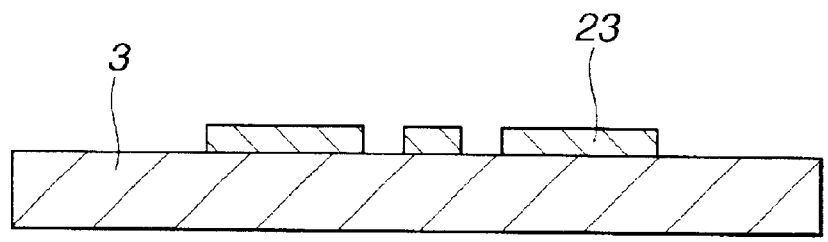
FIGS. 8(a)–(c) are schematic views.
Figure 8B:
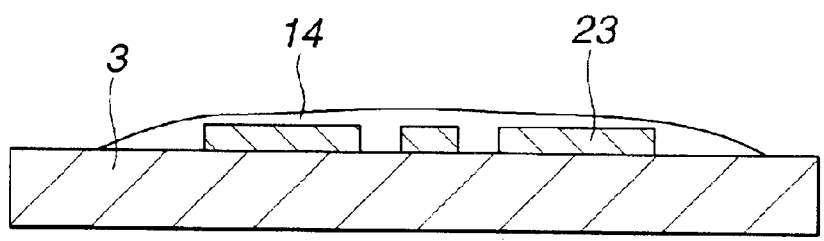
Figure 8C:
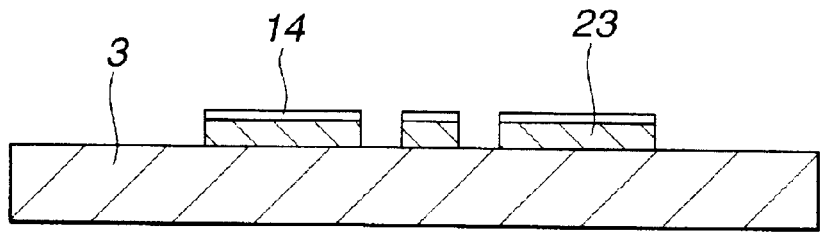

FIG. 8(a)–FIG. 8(c) show an example of a method applicable when the adhesiveness between the substrate 3 and the soot 14 (nano-carbon) is bad. FIG. 8(a)–FIG. 8(c) are variations of the method shown in FIG. 7 and are different from it in that an adhesive layer 23 is placed on the substrate 3.

According to the method, first the patterned adhesive layer 23 is formed on the substrate 3 as shown in FIG. 8(a). The adhesive layer 23 can be formed by various kinds of methods such as a screen printing method and so on. Conductive paste such as Al paste, conductive C paste and so on can be used as the material for the adhesive layer 23.

Next, as shown in FIG. 8(b), the soot (nano-carbon) 14 is deposited by the use of the apparatus shown in FIG. 7 before the adhesive layer 23 has been hardened.

Thereafter, the adhesive layer 23 is hardened. When the adhesive layer 23 is hardened, the soot 14 deposited on the adhesive layer 23 is bonded to the adhesive layer 23.

Last, the whole of the substrate 3 is cleaned by, for example water to remove the soot 14 deposited on the substrate 3, as a result, the soot 14 deposited on the adhesive layer 23 can be formed in the pattern as shown in FIG. 8(c).

When the adhesive layer 23 is used for an electron emitting source, it may be used a cathode electrode or cathode electric wiring.

The method of using the nano-carbon prepared according to the present invention as an electron emitting source is a conventional diode or triode.

In particular, the nano-carbon prepared according to the present invention as an electron emitting source is suitable for a display tube, a display panel, a light-emitting element, a light-emitting tube, a light-emitting panel and so on.

The nano-carbon prepared according to the present invention as an electron emitting source can be applied to a display apparatus having a complicated pattern by emitting an electron from the nano-carbon generated at a specific place.

The nano-carbon or composite soot comprising the nano-carbon and metal fine particles prepared according to the method of the present invention is suitably used as a hydrogen storage material.

Figure 9:
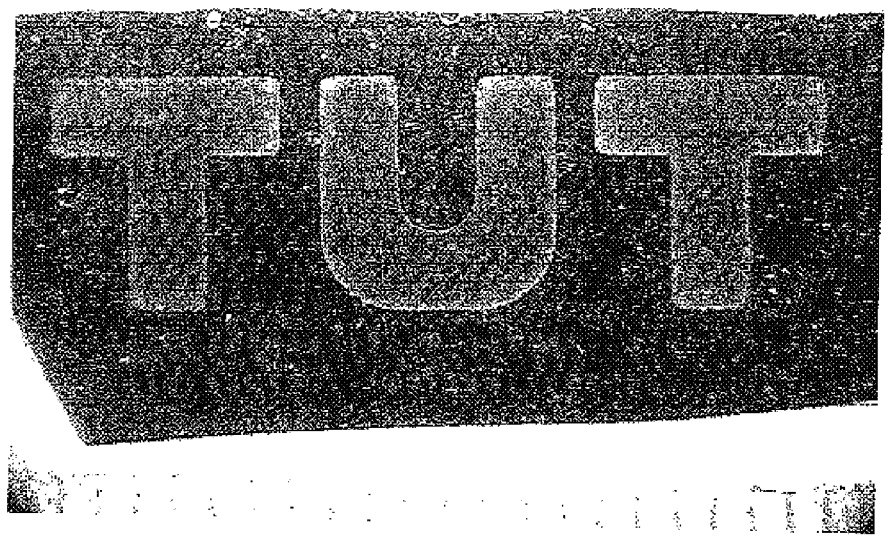
FIG. 9 is a view showing an electron emitting source having specific patterns (arrangement of letters TUT) prepared by making use of the method shown by FIG. 7.

Results obtained by the specific examples are described below:

FIG. 9 is a photograph of an electron emitting source prepared in patterns of arrangement of letters TUT prepared by the use of the apparatuses shown in FIGS. 1 and 7.

The substrate as a base material is conductive Si. The material to be arced is prepared by using a graphite plate containing Ni/Y (contents of Ni and Y contents: 4.2 and 1.0 mol %, plate thickness: 2 mm, width: 5 mm) and direct current of 100 A in open atmosphere (at atmospheric pressure).

When activated carbon or amorphous carbon or metal catalyst-containing graphite was used instead of a graphite plate, substantially the same results as those by the graphite plate were obtained. When a specific gas, above all rare gas is used, the yield of the nano-carbon prepared was increased. Accordingly, it was confirmed that the use of rare gas was extremely effective.

Figure 10:
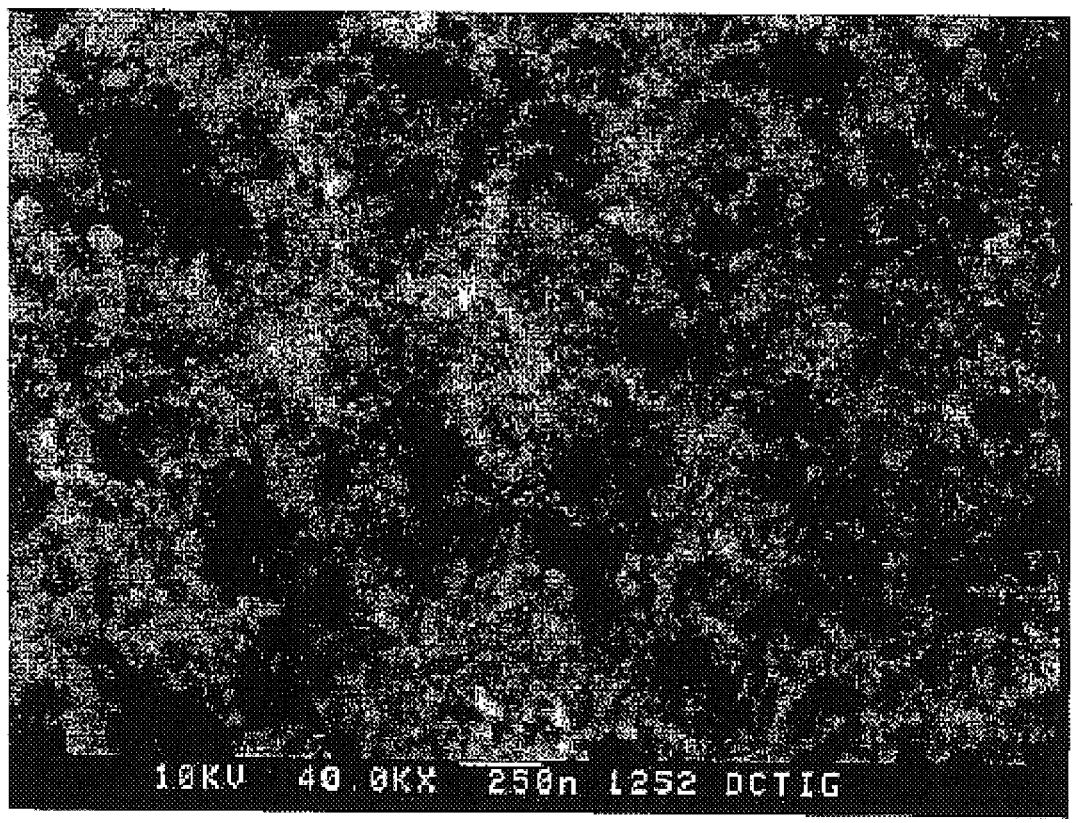
FIG. 10 is a view showing the state of the surface of the electron emitting source having specific patterns (surface of deposit) prepared by FIG. 9.
Figure 11:
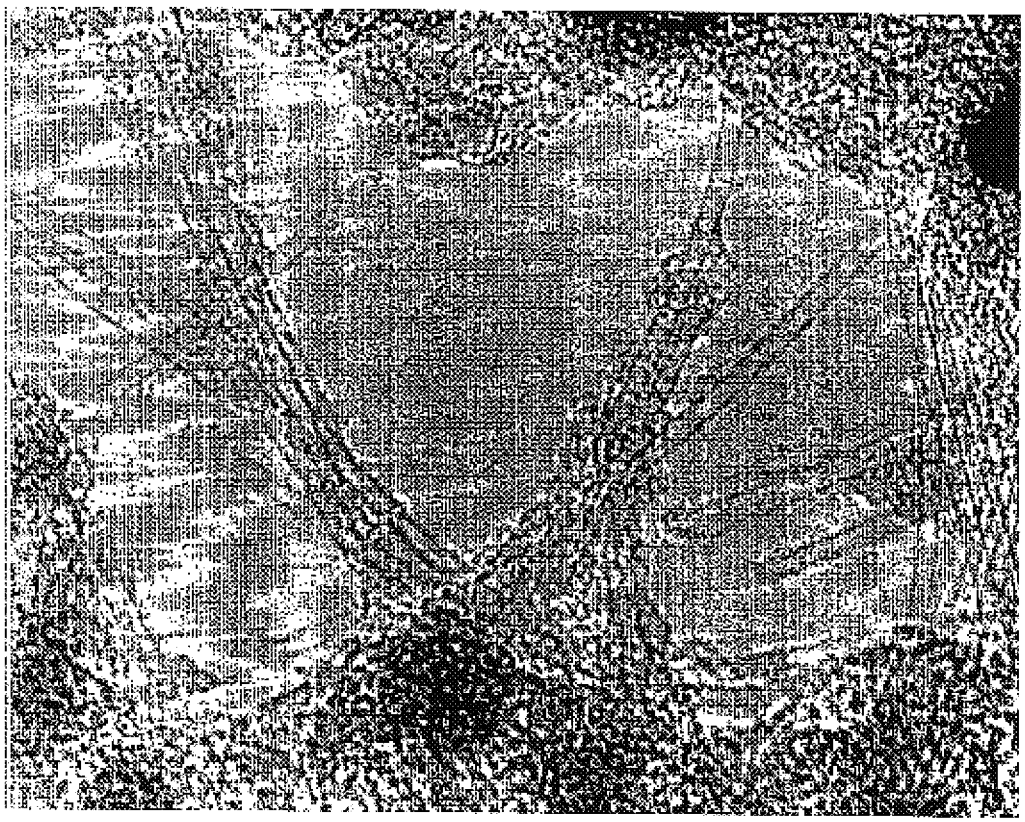
FIG. 11 is a view showing a single layer nano-tube which exists in the electron emitting source having specific patterns (surface of deposit) shown by FIG. 10.

FIG. 10 is a scanning electron microscope (SEM) photograph showing the deposits. It is evident that nano-size structures are dispersed everywhere. As shown in FIG. 11, the deposits contained single layer nano-tubes and nano-horns therein. The term "nano-horn" herein used means a carbon nano-particle having a shape that a sheet of graphite is rounded into conical shape two ends of which are closed in a conical shape (publications "Pore structure of single-wall carbon nano-horn aggregates/K. Murata, K. Kaneko, F. Kokai, K. Takahashi, M. Yudasaka, S. Iijima/Chem. Phys. Lett., vol. 331, pp. 14–20(2000)").

When an electron was emitted by using the sample with a diode-type fluorescence emitting tube and a fluorescent screen was irradiated with the electron, luminescence of the fluorescent screen was visually observed. In this case, results obtained by the use of activated carbon, amorphous carbon or additive-containing graphite and results obtained by specific gas were the same as those shown in FIG. 9.

While each of the above-described examples shows an example in which nano-carbon deposited on the base material (substrate 3) was used as such, it is naturally possible that nano-carbon is removed from the base material (substrate 3) and is used as a composite of the nano-carbon and metal particles. And further, it is also naturally possible that the soot is purified and used as nano-carbon such as a simple body of nano-tube and so on is removed FIG. 12~FIG. 14 are photomicrographs of a transmission electron microscope showing the soot recovered from the base material (substrate 3) prepared by the use of the apparatus shown in FIG. 1.

Figure 12:
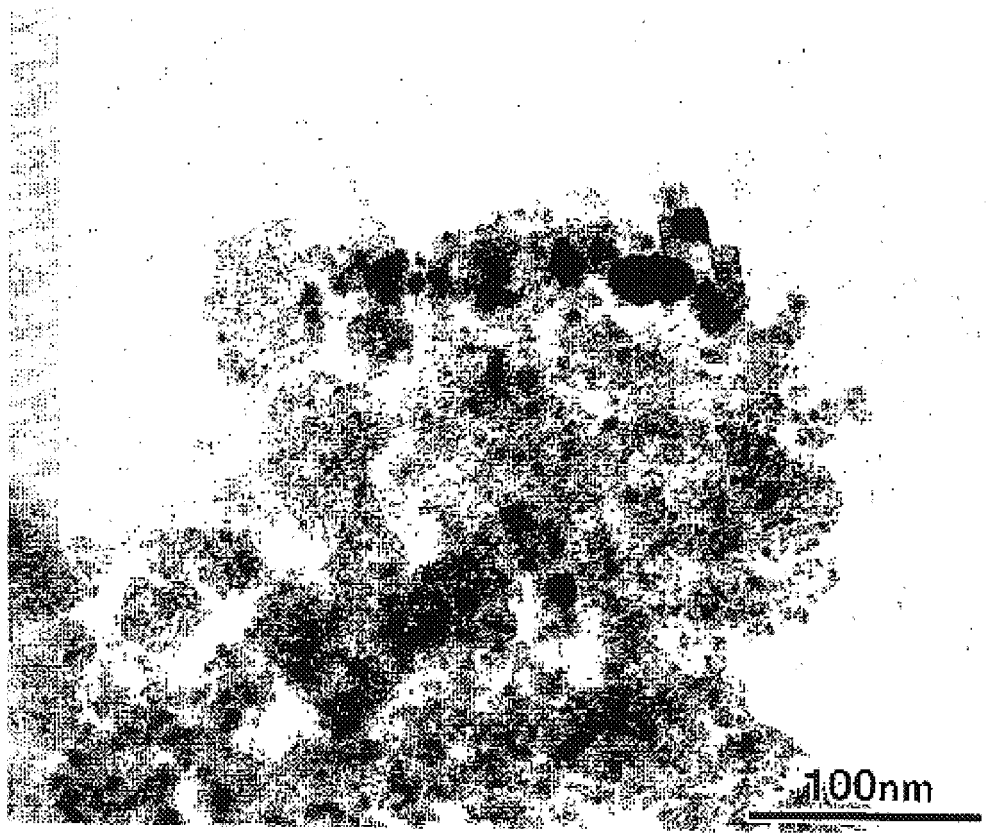
FIG. 12 is a photomicrograph of soot prepared by making use of the apparatus shown by FIG. 1 by a transmission electron microscope (TEM) at low magnification.

FIG. 12 is a photomicrograph taken at low magnification. As shown in FIG. 12, lightly colored portions are carbon materials and highly colored portions are metal fine particles, and they are intermingled and aggregated. It is shown that a bundle of needle-shaped single layer nano-tubes projects out from the end of the aggregates.

Figure 13:
FIG. 13 is a photomicrograph of soot (composite comprising single layer nano-tube and metal fine particles) prepared by making use of the apparatus shown by FIG. 1 by a transmission electron microscope (TEM) at high magnification.

FIG. 13 is a photomicrograph of another view taken at high magnification. FIG. 13 shows that single carbon nano-tubes are formed in the shape of bundle. The single carbon nano-tube grows by virtue of metal fine particles as catalyst.

Figure 14:
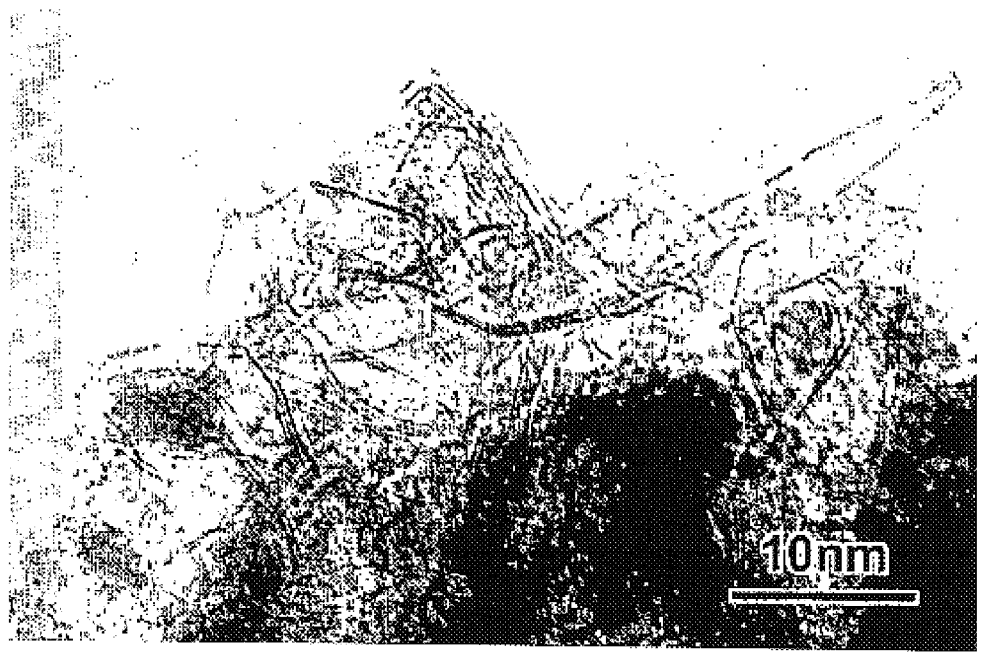
FIG. 14 is a photomicrograph of soot (nano-horn) prepared by making use of the apparatus shown by FIG. 1 by a transmission electron microscope (TEM) at high magnification.

FIG. 14 is a photomicrograph of another view taken at high magnification. As shown in FIG. 14, carbon nano-horns are evidently formed.

The samples shown in FIGS. 12~14 comprise approximately 70~80 mol % of carbon, 2~10 mol % of oxygen, 1~5 mol % of yttrium (Y) and 4~20 mol % of nickel (Ni). 1~30 mol % is a single layer nano-tube, and 0.1~5 mol % are nano-horn. 0.1~5 mol % of multi-layer nano-tubes were observed. The remaining carbon components are carbon nano-fine particles and amorphous carbon.

The nano-carbon or composite soot (composite material) comprising nano-carbon and metal fine particles prepared according to the method of production of the present invention can be used as a hydrogen storage material. When the hydrogen storing rate was measured by volumetric analysis method, it was 1~10 wt % at ordinary temperatures and 30 atmospheric pressure, but it was 0.1~1 wt % at ordinary temperatures and normal pressures. By optimizing the manufacturing conditions, the hydrogen storing rate above such values can be expected. Therefore, the nano-carbon-containing soot prepared according to the method of production of the present invention, per se, is suitable for a gas storage material such as a hydrogen storage material and so on. In addition to this, the amorphous carbon fine particle has a space capable of storing hydrogen. Since a metal component such as Ni, Y and so on has hydrogen storing properties, it is suitable for a gas storage material such as a hydrogen storage material and so on. Accordingly, operations for removing nano-carbon from the soot are not necessarily required.

The nano-carbon prepared according to the method of production of the present invention is characterized in that the soot contains not only a single layer nano-tube, but also a multi-layer carbon nano-tube, a carbon nano-horn, a carbon nano-fine particle, amorphous carbon and fullerenes at the same time. Therefore, if the operations for removing nano-carbon from the soot are carried out, the nano-carbon can be used as one kind or several kinds of nano-carbons.

In order to remove the nano-carbon from the soot to purify, removal of large particles by a screen or centrifugal apparatus, removal of amorphous components by oxidation under superheating, removal of metal components by acid, alkali, aqua regia or reverse aqua regia can be used.

The multi-layer carbon nano-tube exists when the graphite is used as a torch electrode. This is because that the multi-layer carbon nano-tube formed on the surface of the graphite electrode is blown away and get mixed in the soot. The CN nano-tube, CN nano-fiber, CN nano-particle can be prepared by using nitrogen as a sealed gas. The BCN nano-tube, BCN nano-fiber, BCN nano-particle can be prepared by adding B into the carbon electrode and using nitrogen as a sealed gas. The soot is a mixture of several kinds of nano-carbons.

In the case of the composite or mixed soot comprising nano-carbon and metal fine particles (composite or mixed material), the term "metal fine particles" means precisely "additive fine particles containing metal fine particles", because an additive added or applied is not only metal.

The size of the metal fine particle is approximately from 1 nm to typically 1 $\mu$m in maximum (size of an original additive: up to 10 $\mu$m in maximum). The material is a composition of additive and carbide thereof and so on. The metal fine particles are formed by melting, evaporating, atomization and aggregating in the course of cooling. The metal fine particles exist in a state of a simple body or carbide and so on. In the case of a plurality of additives, the metal fine particles exist in a state of a simple body and alloy and carbide thereof.

Figure 15:
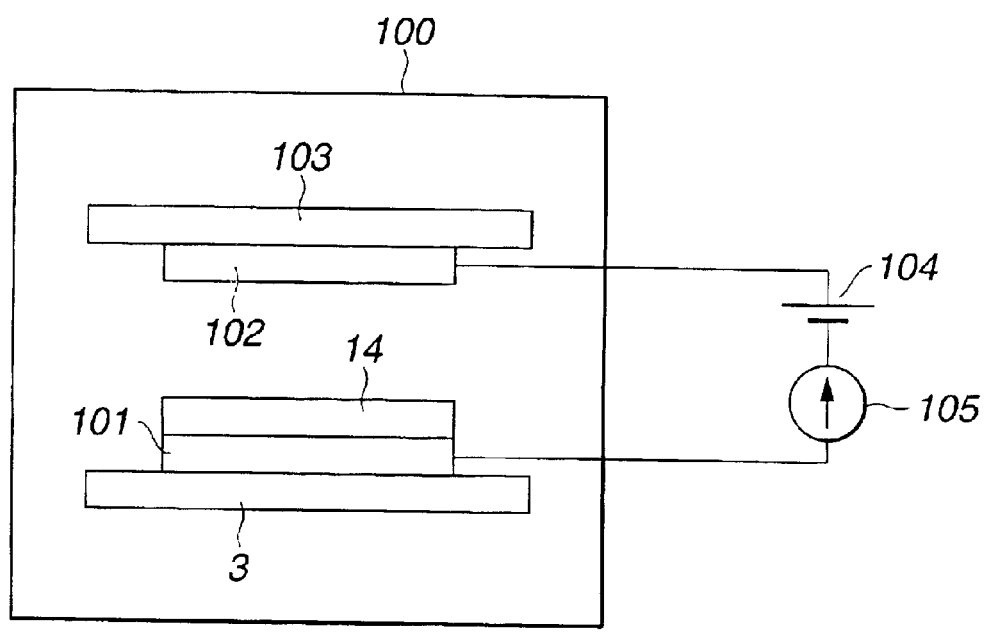
FIG. 15 is a schematic view showing an apparatus for measuring electron emission characteristics of the electron emitting source according to an example of the present invention.

FIG. 15 shows an apparatus for measuring electron emission characteristics of an electron emitting source. The apparatus shown in FIG. 15 is an apparatus for measuring electron emission characteristics of the electron emitting source (electron emitting element) using the soot 14 comprising nano-carbon and metal particles as an electron emitting material, and a conventional electron emitting source using a single layer carbon nano-tube as an electron emitting material to compare them. In FIG. 15, the substrate (cathode substrate) 3 is placed opposite to the anode substrate 103 in the vacuum chamber 100. On the substrate 3, the cathode electrode 101 is stacked to the layer of soot 14 (emitter layer). On the anode substrate 103, the anode electrode (lead wire) 102 is formed. The distance between the substrate 3 and the anode substrate 103 is set at 100 $\mu$m. A direct current electric source 104 and an ammeter 105 are connected in series.

Figure 16:
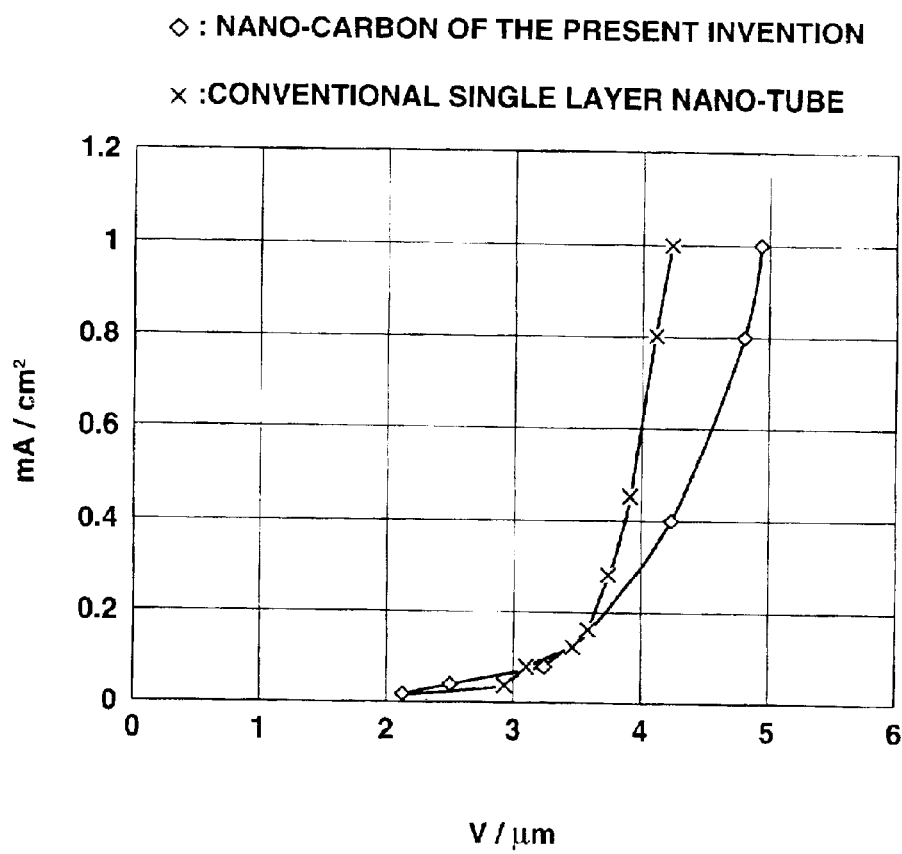
FIG. 16 is a chart showing electron emission characteristics of the electron emitting source according to an example of the present invention.

FIG. 16 is a chart showing a comparison between the electron emission characteristics of the electron emitting source using the soot 14 comprising nano-carbon and metal particles as an electron emitting material, and the electron emission characteristics of the electron emitting source using a single layer carbon nano-tube instead of the soot 14 as an electron emitting material by the use of the apparatus shown in FIG. 15. The single layer carbon nano-tube is that prepared by a conventional vacuum arc discharge method. As shown in FIG. 16, it is evident that the initial kick-off characteristics and the electron emission characteristics of the electron emitting source using the soot 14 (nano-carbon) prepared in atmosphere are not inferior to those of the electron emitting source using a conventional single layer carbon nano-tube prepared in vacuum.

The nano-carbon prepared according to the method of production of the present invention can be used for an additive for a secondary battery electrode, a secondary battery electrode, and an additive for a fuel cell electrode and a fuel cell electrode.

The nano-carbon prepared according to the method of production of the present invention can be used for an additive for a material such as rubber, plastics, resin, ceramics, steel, concrete and so on. By mixing the nano-carbon with such a material, its strength, thermal conductivity, electrical conductivity and so on can be improved.

While a plate-shaped base material was used as the base material (substrate 3) in each of the above-described examples, another base material such as a cylinder-shaped one, a square column-shaped one, a sphere-shaped one and so on may be used.

While a conductive S1 substrate (conductive substrate) was used as the base material (substrate 3), an insulating substrate such as glass, ceramics and so on, an insulating substrate prepared by forming an insulating layer on a conductive substrate, a conductive substrate such as metal and so on, or a conductive substrate prepared by forming an conductive layer on the surface of the insulating substrate may be used.

A flexible member such as a film and so on may be used other than a substrate.

When the base material is placed in the vicinity of the arc-discharge-generating area, it is necessary to use a heat-resistant base material.

According to the present invention, there is provided an extremely simple method of preparing nano-carbon, a patterning method, and an apparatus for production (including patterning apparatus).

According to the present invention, there is provided a carbon nano-material capable of being easily prepared and continuous-mass-produced, an electron emitting source using the same (electron emitting substrate), a method of preparing a hydrogen storage material, a patterning method and an apparatus for production.

According to the present invention, there is provided a method of patterning easily a cluster of nano-carbons in the desired pattern at optional one place or several places and a patterning apparatus.

What is claimed is:

1. A method of preparing nano-carbon comprising the steps of:
   placing a first electrode opposite to a second electrode containing a carbon material as a main component in atmosphere or air;
   applying voltage between said first electrode and second electrode to generate arc discharge;
   evaporating said carbon material of said second electrode by said arc discharge to generate soot containing nano-carbon; and
   recovering said soot containing nano-carbon.

2. A method of preparing nano-carbon according to claim 1, wherein said first electrode is a torch electrode mounted to an arc torch, and the method is provided with a step of generating soot containing nano-carbon by evaporating said carbon material of said second electrode by said arc discharge while making relative motion between said torch electrode and said second electrode.

3. A method of preparing nano-carbon according to claim 1, wherein a base material is placed opposite to an arc discharge-generating area, and the method comprises a step of recovering said soot containing nano-carbon through said base material.

4. A method of preparing nano-carbon according to claim 1, wherein fluid or particulate material is placed opposite to an arc discharge-generating area, and the method comprises a step of recovering said soot containing nano-carbon through said fluid or particulate material.

5. A method of preparing nano-carbon according to claim 1, wherein an angle which said first electrode forms with said second electrode is in the range of 45 degrees to 135 degrees.

6. A method of preparing nano-carbon according to claim 1, wherein said soot comprises at least one nano-carbon material selected from the group consisting of a single layer carbon nano-tube, carbon nano- horn, multi-layer carbon nano-tube, carbon nano-fiber, carbon nano-particle, CN nano-tube, CN nano-fiber, CN nano-particle, BCN nano-tube, BCN nano-fiber, BCN nano-particle, fullerenes, and mixtures thereof.

7. A method of preparing nano-carbon according to claim 1, wherein said soot is a composite or mixed soot comprising nano-carbon and metal fine particles.

8. A method of preparing nano-carbon according to claim 1, wherein said carbon material of said second electrode is graphite or activated carbon or amorphous carbon, additive-containing or additive-embedded graphite or activated carbon or amorphous carbon, or graphite or activated carbon or amorphous carbon a part or whole surface of which is sprayed, applied, plated or coated with an additive.

9. A method of preparing nano-carbon according to claim 8, wherein said additive is Li, B, Mg, Al, Si, P, S, K, Ca, Ti, V, Cr, Mn, Fe, Co, Ni, Cu, Zn, Ga, Ge, As, Y, Zr, Nb, Mo, Rh, Pd, In, Sn, Sb, La, Hf, Ta, W, Os, Pt, oxide thereof, nitride thereof, sulfide thereof, chloride thereof, sulfate thereof, nitrate thereof, or mixture thereof.

10. A method of preparing nano-carbon according to claim 1, wherein said arc discharge is operated by direct current or direct current plasma, and arc discharge of said second electrode is a cathode for arc discharge.

11. A method of preparing nano-carbon according to claim 1, wherein said arc discharge is operated by alternating current or alternating current plasma.

12. A method of preparing nano-carbon according to claim 1, wherein nano-carbon-containing soot is generated by evaporating said carbon material in an edge or depression or projection of said second electrode by said arc discharge.

13. A method of preparing nano-carbon according to claim 1, wherein said arc discharge is carried out while supplying specific gas or air into said arc discharge-generating area.

14. A method of preparing nano-carbon according to claim 13, said specific gas is selected from the group consisting of inert gas of Group 18, nitrogen gas, carbon dioxide gas, oxygen gas, hydrogen gas, and mixtures thereof.

15. A method of preparing nano-carbon according to claim 1, wherein said first electrode contains as a main component high-melting point metal of graphite, W(tungsten), Mo(molybdenum), or Ni(nickel).

16. A method of patterning nano-carbon comprising the steps of:

placing a first electrode opposite to a second electrode containing a carbon material as a main component in atmosphere or air;

applying voltage between said first electrode and second electrode to generate arc discharge;

evaporating said carbon material of said second electrode by said arc discharge to generate nano-carbon-containing soot; and placing a base material on a surface or upper portion of which is placed a mask having a patterned opening opposite to said arc discharge-generating area, thereby depositing said nano-carbon-containing soot on the surface of said base material corresponding to said opening.

17. A method of patterning nano-carbon according to claim 16, wherein the method further comprises a step of:

placing said base material in fluid opposite to said arc discharge-generating area, thereby depositing said nano-carbon-containing soot on the surface of said base material corresponding to said opening.

18. A method of patterning nano-carbon comprising the steps of:

placing a first electrode opposite to a second electrode containing a carbon material as a main component in atmosphere or air;

applying voltage between said first electrode and second electrode to generate arc discharge;

evaporating said carbon material of said second electrode by said arc discharge to generate nano-carbon-containing soot; and placing a base material a surface of which has an adhesive layer opposite to said arc discharge-generating area, thereby depositing said nano-carbon-containing soot at least on said adhesive layer.

19. A method of patterning nano-carbon according to claim 16 or 18, wherein;

said first electrode is a torch electrode mounted on an arc torch;

the method further comprises a step for generating nano-carbon-containing soot by evaporating said carbon material in the edge or depression or projection of said second electrode by said arc discharge while making relative motion between said torch electrode and said second electrode.

* * * * *

UNITED STATES PATENT AND TRADEMARK OFFICE
CERTIFICATE OF CORRECTION

PATENT NO. : 6,827,823 B2
DATED : December 7, 2004
INVENTOR(S) : Takikawa et al.

It is certified that error appears in the above-identified patent and that said Letters Patent is hereby corrected as shown below:

<u>Title page,</u>
Items [45] and [*] Notice, should read as follows:
-- [45] Date of Patent: **\*Dec. 7, 2004**

[*] Notice: Subject to any disclaimer, the term of this patent is extended or adjusted under 35 U.S.C. 154(b) by 0 days.

This patent is subject to a terminal disclaimer. --

Signed and Sealed this

First Day of March, 2005

JON W. DUDAS
*Director of the United States Patent and Trademark Office*